United States Patent [19]

Yamazaki et al.

[11] Patent Number: 5,275,324
[45] Date of Patent: Jan. 4, 1994

[54] WIRE BONDING APPARATUS

[75] Inventors: Nobuto Yamazaki, Tokyo; Mitsuaki Sakakura, Saitama; Koichi Harada, Tokyo; Minoru Torihata, Saitama, all of Japan

[73] Assignee: Kabushiki Kaisha Shinkawa, Tokyo, Japan

[21] Appl. No.: 36,478

[22] Filed: Mar. 24, 1993

[30] Foreign Application Priority Data

Mar. 26, 1992 [JP] Japan .................................. 4-98614

[51] Int. Cl.⁵ .............................................. B23K 20/10
[52] U.S. Cl. ........................................ 228/1.1; 228/4.5
[58] Field of Search ............................... 228/1.1, 4.5

[56] References Cited

U.S. PATENT DOCUMENTS 3,384,283 5/1968 Mims ..................................... 228/1.1
3,602,420 8/1971 Wilkinson ............................. 228/1.1
3,610,506 10/1971 Robinson ........................... 228/1.1 X Primary Examiner—Kenneth J. Ramsey
Attorney, Agent, or Firm—Koda and Androlia

[57] ABSTRACT

A wire bonding apparatus in fabricating, for example, semiconductor devices including a bonding arm that is vertically and horizontally movable and has a capillary through which a bonding wire is passed. The bonding arm is provided with a piezoelectric element which transmits a vibration to the capillary via its electric strain effect or magnetic strain effect so that the capillary performs wire bonding. With the use of the piezoelectric element that is provided near the capillary, vibrational energy loss can be minimal, and the frequency and amplitude of the vibration can be changed during each bonding operation.

4 Claims, 2 Drawing Sheets

WIRE BONDING APPARATUS

BACKGROUND OF THE INVENTION

1. Field of the Invention

The present invention relates to a wire bonding apparatus used for, for example, semiconductor manufacturing.

2. Prior Art

In conventional wire bonding apparatuses, a bonding arm is attached to a bonding head (which is driven in the X and Y directions by an XY table) either directly or via a lifter arm. The bonding arm can move upward and downward or swing, and a capillary through which a bonding wire is passed is attached to the front end of the bonding arm. A vibrator that transmits a vibration to the bonding arm is mounted to the rear end of the bonding arm or on the bonding head side. When the wire or a ball formed at the tip end of the wire is bonded to a workpiece, the vibrator and the bonding arm are caused to resonate at an appropriate resonance frequency.

In this prior art, the attachment of the bonding arm to the bonding head or the lifter arm is limited to the node (vibrational node) of the bonding arm. In addition, there are restrictions on the shape, length, etc., of the bonding arm when obtaining a desired resonance. Thus, there are problems in terms of design and quality control. Moreover, since the vibration of the vibrator is transmitted from the rear side of the bonding arm to the capillary which is at the front end of the bonding arm, the conversion efficiency of the vibrational energy is poor. In addition, since the resonance frequency shifts due to fluctuations in the load when bonding is performed, a frequency tracking circuit must be installed to track the resonance frequency.

SUMMARY OF THE INVENTION

Accordingly, the object of the present invention is to provide a wire bonding apparatus in which there are no restrictions on the attachment of the bonding arm nor on the shape of the rear part of the bonding arm, in which a reduction in size and weight of the bonding arm is accomplished, in which the loss of vibrational energy is small so that a stable vibrational energy is supplied to the capillary, and in which the frequency and amplitude of the vibration can be changed during each bonding operation.

The object of the present invention described above is accomplished by a unique structure for a wire bonding apparatus in which a bonding arm that moves up and down and/or swings has, at its end, a capillary through which a bonding wire is passed, and the unique structure is that a piezoelectric element which transmits a vibration to the capillary via its electric strain effect or magnetic strain effect is provided in the bonding arm at a position near the capillary.

When the wire or a ball formed at the tip end of the wire projecting from the capillary is pressed against the workpiece by the capillary and is bonded, a voltage is applied to the piezoelectric element at a certain frequency. When the voltage is applied to the piezoelectric element at a certain frequency, the piezoelectric element repeatedly expands and contracts due to its electric strain effect or magnetic strain effect. The vibration caused by this expansion and contraction of the piezoelectric element is transmitted to the capillary via the bonding arm so that the wire is bonded to a workpiece by the vibrational energy transmitted to the capillary.

DETAILED DESCRIPTION OF THE INVENTION

One embodiment of the present invention will be described with reference to the accompanying drawings.

Figure 1:
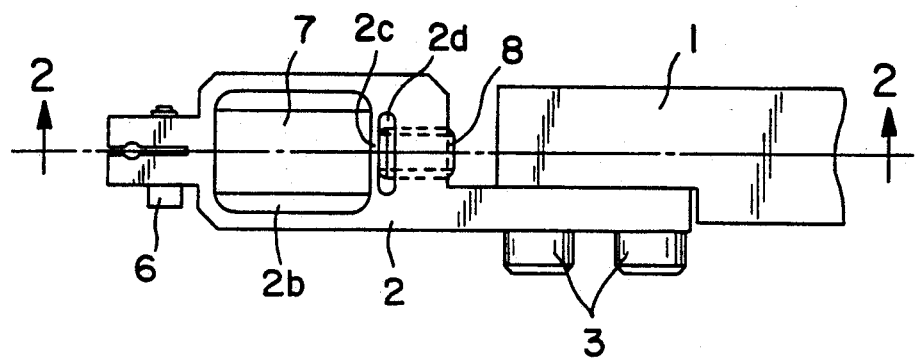
FIG. 1 is a top plan view illustrating the main parts of one embodiment of the wire bonding apparatus of the present invention.
Figure 2:
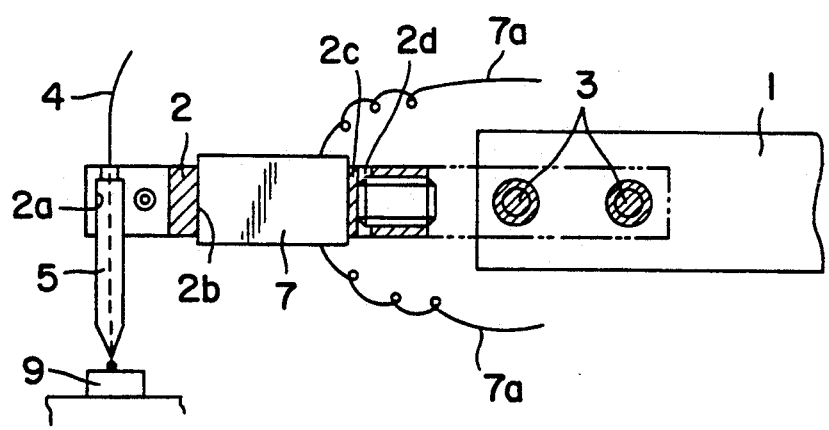
FIG. 2 is a vertical cross section taken along the line 2—2 in FIG. 1.

As shown in FIGS. 1 and 2, bonding arm 2 is fastened at the base end to a lifter arm 1 by bolts 3, and a capillary 5 is attached to the tip end of the bonding arm 2 by a bolt 6. A bonding wire 4 is passed through the capillary 5. The capillary 5 is installed in a capillary hole 2a which is formed in the bonding arm 2. The capillary hole 2a has steps inside so that the capillary 5 installed therein can be adjusted in a vertical direction or heightwise.

A piezoelectric element attachment opening 2b which is more or less a square shape is opened in the bonding arm 2, and both ends of a laminated piezoelectric actuator 7 (hereafter referred to as a "piezoelectric element") are fastened inside this piezoelectric element attachment opening 2b via an adhesive The piezoelectric element 7 is installed so that its strain direction is perpendicular to the central axis of the capillary 5. Furthermore, an elongated opening 2d is opened in the bonding arm 2. The elongated opening 2d is located on the other side of the piezoelectric element attachment opening 2b from the capillary 5 with a thin wall 2c left between the two openings 2b and 2d. A pressing bolt 8 is screwed into the bonding arm 2 so that it can press against the thin wall 2c. When the pressing bolt 8 is turned, a preliminary pressure is applied to the piezoelectric element 7 via the thin wall 2c. For example, a preliminary pressure of approximately 2 to 8 kg is applied by a torque wrench, and after the preliminary pressure is applied, the pressing bolt 8 is fastened in place by means of an adhesive. In FIG. 2, reference numeral 9 is a workpiece, and 7a is a wiring connecting the piezoelectric element 7 to a voltage power source (not shown).

Figure 3:
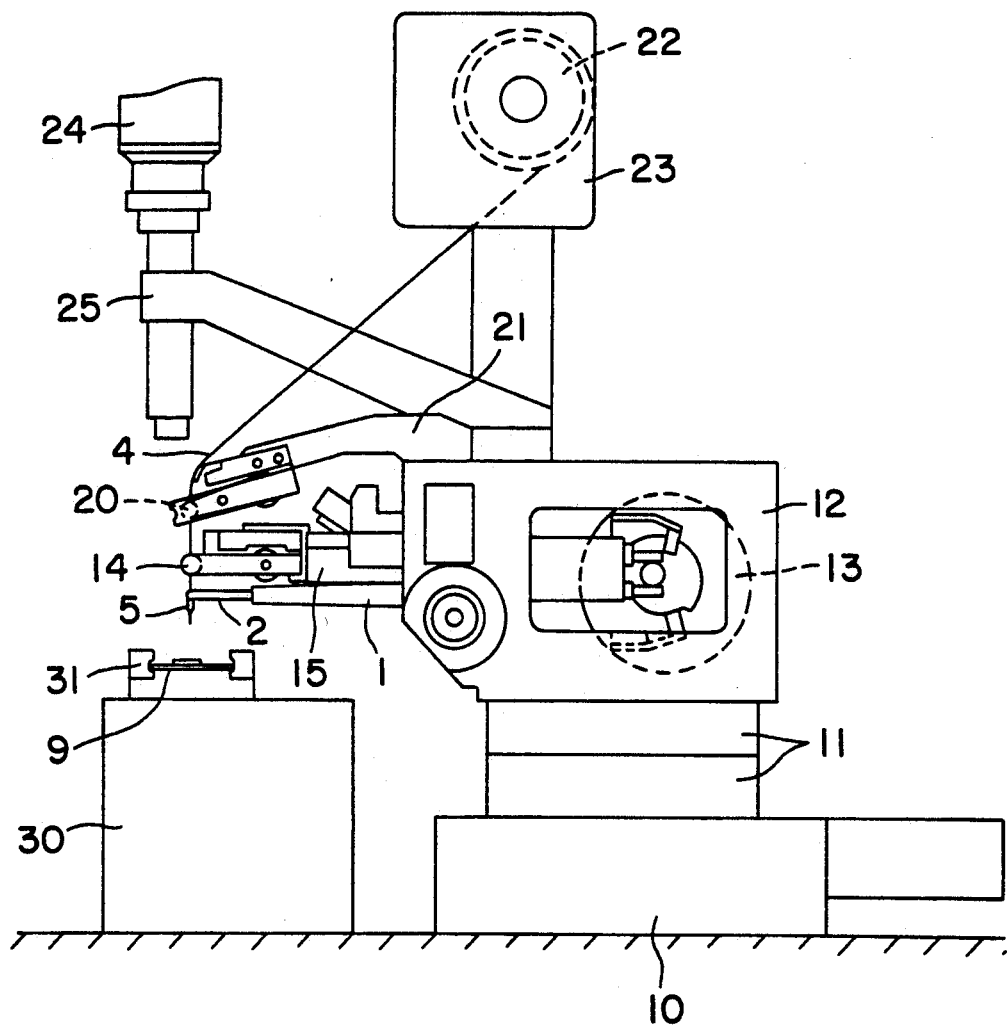
FIG. 3 is a side view of a wire bonding apparatus according to the present invention.

FIG. 3 illustrates a wire bonding apparatus according to the present invention. An XY table 11 which is rotated in the X and Y (or horizontal) direction is provided on a stand 10, and a bonding head 12 is mounted on the XY table 11. The lifter arm 1 is installed on the bonding head 12 so that it can move up and down by means of a motor 13. A first clamper support 15 which has a wire cutting clamper 14 is mounted on the lifter arm 1. Furthermore, a second clamper support 21 is mounted on the bonding head 12. A wire-holding clamper 20 for holding the wire 4 lightly, a spool support 23 for supporting a wire spool 22 and a camera support 24 for supporting a camera 23 that detects the workpiece are all mounted on the second clamper support 21. The wire 4 is fed out of the wire spool 22 and passed through the wire-holding clamper 20, the wire-cutting clamper 14, and then the capillary 5. In FIG. 3, reference numeral 30 is a feeder which carries the workpiece 9, and 31 is a pair of guide rails that guide the workpiece 9.

The operation of the apparatus described above will be given below:

The bonding operation is performed by a conventional and known method. In other words, the capillary 5 is moved in the X and Y (or horizontal) directions via the XY table 11 and in the vertical direction via the lifter arm 1 that is driven by the motor 13. A more detailed description of the bonding operation will be omitted.

When the capillary 5 comes into contact with the workpiece 9 (or more accurately, when the ball formed at the end of the wire 4 contacts the workpiece 9 at a first bonding point and when the wire 4 contacts the workpiece 9 at second bonding point) so that the wire 4 is bonded to the workpiece 9, a voltage is applied to the wiring 7a of the piezoelectric element 7 at a certain frequency. When the voltage is applied to the piezoelectric element 7 at a certain frequency, the piezoelectric element 7 repeatedly expands and contracts as a result of the electric strain effect or magnetic strain effect. The vibration caused by this expansion and contraction of the piezoelectric element 7 is transmitted to the capillary 5 via the bonding arm 2. As a result of the vibrational energy transmitted to the capillary 5, the wire 4 is bonded to the workpiece 9.

Since the piezoelectric element 7 which applies a vibration to the capillary 5 is mounted to the bonding arm 2 so that it is in the vicinity of the capillary 5, there are no restrictions on the shape of the rear part of the bonding arm 2 nor the method of attachment of the bonding arm 2 to the lifter arm 1. Also, since the apparatus operates on the basis of the electric strain effect or magnetic strain effect of the piezoelectric element 7, there is no need to match the length of the bonding arm 2 to a resonance frequency. Thus, the apparatus can be light and compact. Furthermore, though a conventional vibrator weighs approximately 30 g, the piezoelectric element 7 used in the present invention weighs approximately 3 g which is approximately 1/10 of the vibrator. In this respect as well, the apparatus can be lighter and more compact. Furthermore, in conventional bonding methods that use a resonance, the resonance frequency tends to shift due to fluctuations in the load during bonding; thus, tracking must be performed via a frequency tracking circuit. In the present invention, on the other hand, since a non-resonance system is utilized, there is no need for a frequency tracking circuit, and a stable vibrational energy can be supplied. In addition, since the piezoelectric element 7 is caused to vibrate in the vicinity of the capillary 5, there is almost no vibrational energy loss.

As seen from the above, according to the present invention, a piezoelectric element which transmits a vibration to the capillary by means of an electric strain effect or magnetic strain effect is used and provided near a point where the capillary is mounted to the bonding arm. As a result, there are no restrictions on where the bonding arm is mounted or how the rear part of the bonding arm is shaped, and the apparatus can be light and compact. Furthermore, a stable vibrational energy can be transmitted to the capillary with little loss of vibrational energy, and since the apparatus is a non-resonance type, the frequency and amplitude of the vibration can be varied during each bonding operation.

We claim:

1. A wire bonding apparatus comprising a bonding arm which is movable up and down or swingable and has at one end a capillary through which a wire is passed, characterized in that a piezoelectric element which transmits a vibration to said capillary by means of an electric strain effect or magnetic strain effect is installed in said bonding arm at a point where said capillary is provided.

2. A wire bonding apparatus comprising a bonding arm mounted in a vertically and horizontally movable manner, wherein said bonding arm is provided with:
   a capillary attached at a front end of said bonding arm so that a bonding wire passes through said capillary;
   a first opening opened near said capillary;
   a piezoelectric element secured in said first opening and connected to a voltage power source;
   a second opening opened next to said first opening with a thin wall in between; and
   a pressing bolt screwed in said bonding arm so as to press against said thin wall.

3. A wire bonding apparatus according to claim 2, wherein said piezoelectric element is installed so that a strain direction of said piezoelectric element is perpendicular to an axis of said capillary.

4. A wire bonding apparatus comprising a bonding arm that is mounted in a vertically and horizontally movable manner, wherein said bonding arm is provided with:
   a capillary attached at one end of said bonding arm so that a bonding wire passes through said capillary;
   an opening opened near said capillary; and
   a piezoelectric element secured in said opening and connected to a voltage power source, said piezoelectric element being installed so that a strain direction of said piezoelectric element is perpendicular to an axis of said capillary.

* * * * *

UNITED STATES PATENT AND TRADEMARK OFFICE
CERTIFICATE OF CORRECTION

PATENT NO. : 5,275,324
DATED : January 4, 1994
INVENTOR(S) : Nobuto Yamazaki et al.

It is certified that error appears in the above-identified patent and that said Letters Patent is hereby corrected as shown below:

On the title page,

Item: [75] Inventors: Change "Nobuto Yamazaki, Tokyo; Mitsuaki Sakakura, Saitama; Koichi Harada, Tokyo; Minoru Torihata, Saitama, all of Japan" to --Nobuto Yamazaki, Tokyo; Mitsuaki Sakakura, Saitama; Koichi Harada, Tokyo; Minoru Torihata, Saitama; Takayuk. Iiyama, Tokyo, all of Japan--.

Signed and Sealed this

Fifth Day of July, 1994

Attest:

BRUCE LEHMAN

Attesting Officer *Commissioner of Patents and Trademarks*